Jan. 10, 1956 R. S. CARUTHERS 2,730,576

MINIATURIZED TRANSISTOR AMPLIFIER CIRCUIT

Filed Sept. 17, 1951 2 Sheets-Sheet 1

INVENTOR
R. S. CARUTHERS
BY
H. A. Burgess
ATTORNEY

Jan. 10, 1956 R. S. CARUTHERS 2,730,576

MINIATURIZED TRANSISTOR AMPLIFIER CIRCUIT

Filed Sept. 17, 1951 2 Sheets-Sheet 2

INVENTOR
R. S. CARUTHERS

BY H. A. Burgess
ATTORNEY

United States Patent Office 2,730,576

Patented Jan. 10, 1956

2,730,576

MINIATURIZED TRANSISTOR AMPLIFIER CIRCUIT

Robert S. Caruthers, Mountain Lakes, N. J., assignor to Bell Telephone Laboratories, Incorporated, New York, N. Y., a corporation of New York Application September 17, 1951, Serial No. 246,971

1 Claim. (Cl. 179—171)

The present invention relates to amplifiers using a transistor as the amplifying element.

Among the advantages offered by transistors is their small size as compared with vacuum tubes and also the fact that no cathode-heating current need be furnished. Both of these features make for small space requirements which is important in many uses. In attempting to build an audio transistor amplifier of very small physical dimensions, it was found however that the output transformer could not be reduced in size without too much sacrifice in performance characteristics because of the fact that the primary winding dimensions and core size had to be large to accommodate the passage of the direct current through the primary winding to the transistor unit.

The invention solved this difficulty by use of a second transistor as the current feed for the first transistor. This permits use of a stopping condenser in series with the primary winding of the output transformer and allows use of a miniaturized output transformer without sacrifice of amplifier performance. The second transistor acts as a high impedance to the alternating current signal in the collector circuit of the first or amplifying transistor. At the same time the second transistor offers low direct-current resistance in the battery current supply to the collector of the first transistor. Although there is some sacrifice in direct-current efficiency due to wasted power consumption in the second transistor, there is no loss in output signal power.

An object of the invention is to effect a radical space saving in an amplifier circuit without sacrifice of, or with even an improvement in, quality of performance of the amplifier, by enabling a marked reduction to be made in the size of the output transformer.

In one example the problem was to reduce the size of a vacuum tube audio amplifier by substituting a transistor amplifier. Although reductions in size to one-tenth the previous volume were possible in all components except the output transformer, actually the redesigned amplifier was still half its former size because of the size of the output transformer, which remained unchanged. Use of the present invention permits a scaling down of the input and output transformers to miniature sizes in view of removal of all requirement for transmission of direct current through either winding.

Figure 1:
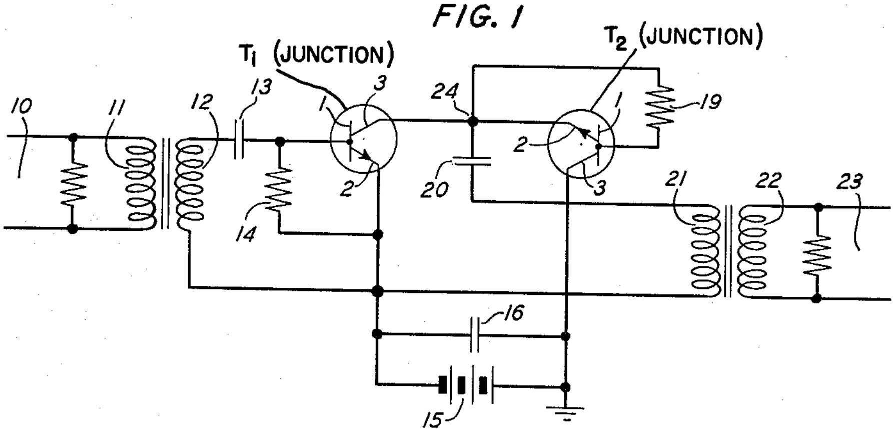
Figure 2:
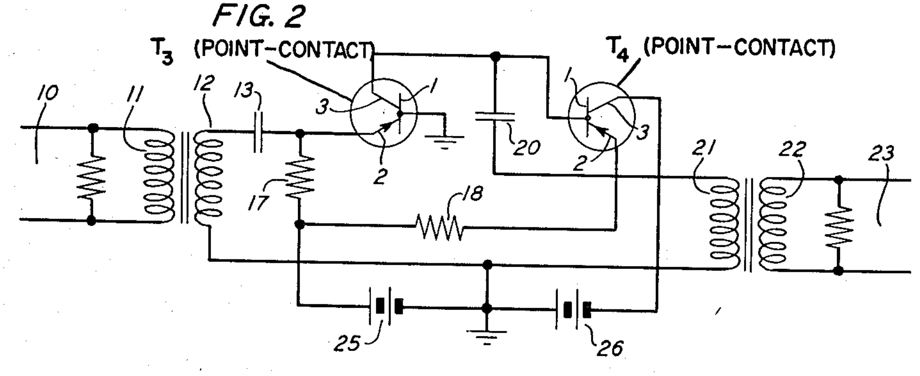
Figure 3:
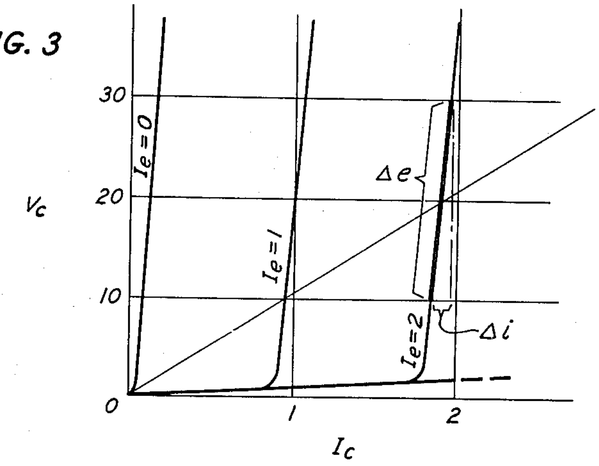

The objects and features of the invention will be made clear from the following description and accompanying drawings in which Figs. 1, 2, 4, 5 and 6 are schematic circuit diagrams respectively, of five amplifier circuits according to the invention, and Fig. 3 shows graphs to be referred to in the description.

Referring to Fig. 1, the two transistors $T_1$ and $T_2$ are illustrated as of the junction type known as NPN transistors, the character of which is disclosed in an article by R. L. Wallace, Jr., and W. J. Pietenpol published in the Bell System Technical Journal for July 1951 entitled "Some Circuit Properties and Applications of n-p-n Transistors" pages 530 to 563. In each of these transistors, the base terminal is indicated at 1, the emitter at 2, and the collector at 3. The pointing of the arrow on the emitter away from the body of the transistor follows convention by indicating the direction of positive emitter current flow, thus denoting p-type material for the central part of the semiconductor to which the base terminal is connected.

An input signal source or circuit 10 is coupled through input transformer 11, 12 and stopping condenser 13 to the base 1 and emitter 2 of transistor $T_1$. Bias resistor 14 connects the base and emitter for direct current. The collector 3 of $T_1$ is connected to emitter 2 of $T_2$, and the collector 3 of $T_2$ is connected to positive battery 15 which latter has its negative pole connected to emitter 2 of $T_1$. Thus, the emitter-collector circuit of $T_1$ is in series with the emitter-collector circuit of $T_2$ and battery 15. Where necessary or desirable, battery 15 may be shunted with condenser 16 to bypass the signal. Transistor $T_2$ has bias resistor 19 connected between its emitter and base.

The amplified signal is taken off through stopping condenser 20 and output transformer 21, 22 and sent into outgoing line or load 23.

Transistor $T_1$ is the active or amplifying transistor and $T_2$ is the current feed transistor for $T_1$. In the absence of signal in the input circuit 10 only direct current flows from the battery through transistor $T_2$ (3 to 2) and in series through $T_1$ (3 to 2) back to battery. Bias resistors 14 and 19 are provided for the base electrodes. When a signal is impressed from line 10 through input coil 11, 12 between the base and emitter of transistor $T_1$ signalling currents amplified by the amplification factor of the transistor $T_1$ are produced across the output terminals, emitter 2 and collector 3. The alternating-current impedance between collector and emitter of transistor $T_2$ is very much higher than its direct-current impedance and very much higher than the impedance of the output circuit branch 20, 21. Consequently, most of the amplified signal takes the latter path and passes on into the output circuit 23.

The transistors $T_1$ and $T_2$ may be assumed to have collector voltage-current characteristics of the type plotted in Fig. 3. A family of curves for different values of emitter current ($I_e$) is shown, with each curve spaced equally apart, indicating a constant value of $\alpha$ or amplification factor. All of these curves approach each other quite closely in slope at an assumed normal operating voltage of 20 volts on the collector. The alternating-current signal swing is indicated on the curve for $I_e$ equal to 2 milliamperes by an extra-heavy portion of length $\Delta e$, and the corresponding change in collector current is indicated at $\Delta i$. The ohmic resistance line from the origin is drawn through the operating point where the curve for $I_e$ equal to 2 milliamperes crosses the 20 volt $V_c$ line. The direct-current resistance is thus about 10,000 ohms, determined by dividing the collector current of slightly less than 2 milliamperes into the collector voltage of 20 volts. However, the alternating-current impedance, indicated by the slope of the $$\frac{\Delta e}{\Delta i}$$

line, is 200,000 ohms. It may thus be seen that the impedance offered by the current feed transistor $T_2$ to current of signal frequency is many times higher than the resistance offered to direct current.

Referring to Fig. 2, transistors $T_3$ and $T_4$ are assumed to be point-contact transistors of the type disclosed in Bardeen-Brattain Patent 2,524,035 issued October 3, 1950, or in the paper published in the Bell System Technical Journal for July 1949 by Messrs. R. M. Ryder and R. J. Kircher, pages 367 to 400. In this case the arrow on the emitter is shown pointing toward the body of the transistor to denote n-type material. The action of the circuit of Fig. 2 is essentially the same as that of Fig. 1. Suitable bias is placed on the emitters by the respective resistances 17 and 18 connected to bias battery 25. Collector current for both transistors is supplied from battery 26 through collector and base of $T_4$, and collector and base of $T_3$ in series. In a particular case used by applicant where power type point-contact transistors were used, the measured direct-current resistance at a base current of 15 milliamperes was 1667 ohms while the alternating-current resistance was 7500 ohms.

Figure 4:
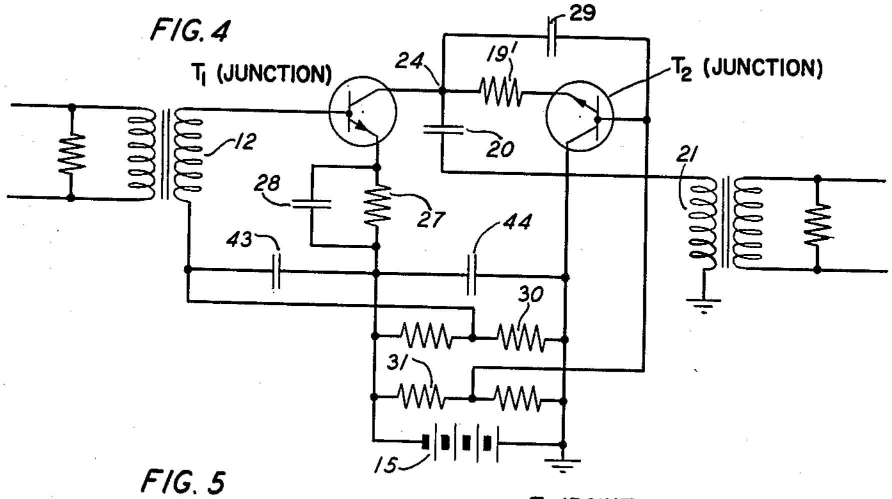

In Fig. 4 a modification of the circuit of Fig. 1 is shown. The same transistors $T_1$ and $T_2$ (NPN type) are assumed in both figures but different biasing circuits are used in Fig. 4 and a further change is made in the circuit of $T_2$.

Resistance 27 and shunt condenser 28 connecting the emitter of $T_1$ to negative battery form a self-biasing arrangement for the emitter in conjunction with a tap point from the base to voltage divider resistance 30 shunted across battery 15. This particular biasing arrangement is the same as that disclosed and claimed in a copending application of R. E. Yaeger, Serial No. 246,823, filed September 15, 1951 (United States Patent 2,680,160, issued June 1, 1954). As explained in the Yaeger application, this biasing method stabilizes the operating point of the transistor $T_1$ for direct current so that it tends to maintain constant the direct component of the emitter current.

In the case of transistor $T_2$ the collector is directly connected to the grounded terminal of battery 15, while the base is connected to a suitable point in voltage divider resistance 31, thus holding a constant voltage on the base. Since the NPN type transistor the emitter and base always operate at close to the same voltage, this circuit also causes the potential of the emitter to assume the same constant value. Thus for direct current, the point 24 is maintained at constant potential.

Applied signal variations through 12 are amplified in the transistor $T_1$ and sent through the output branch 20, 21 as explained in connection with Fig. 1. However, it should be noted that the transistor $T_2$ has a resistor 19' and condenser 29 in series in a branch from emitter to base. This circuit produces series-type negative feedback around the transistor $T_2$ which increases its alternating-current impedance relative to its direct-current resistance, thereby increasing the effectiveness of the transistor $T_2$ as a current feed device for the transistor $T_1$.

Figure 5:
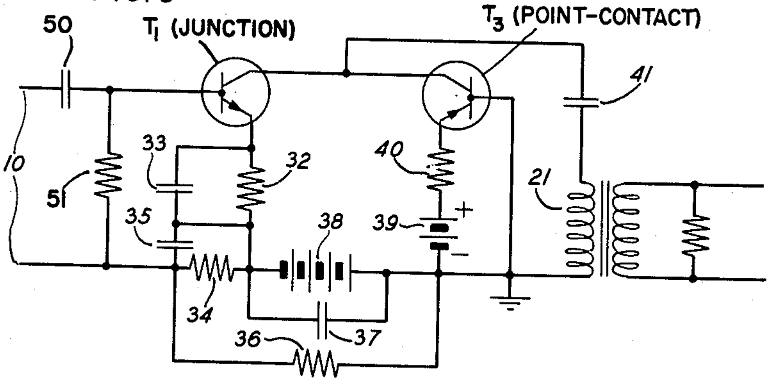
Figure 6:
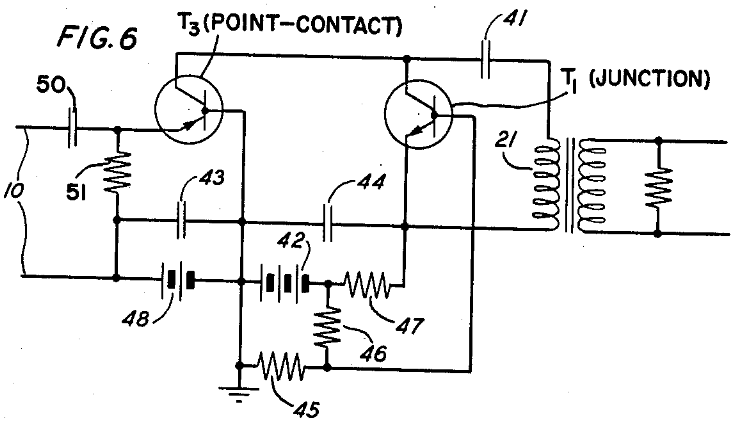

Figs. 5 and 6 represent a variation from the circuits previously described in that each employs an NPN transistor and a point-contact transistor in the same circuit. In Fig. 5 the active or amplifying transistor $T_1$ is an NPN type, while the current feed transistor $T_3$ is of the point contact type.

Although the signal input coupling in Fig. 5 could just as well comprise a transformer, it is shown for illustration as including series capacity 50 and shunt resistance 51. The Yaeger type of biasing is applied to the transistor $T_1$ consisting of potentiometer resistors 34 and 36 across battery 38 for biasing the base and resistance 32 for biasing the emitter. Condensers 33, 35 and 37 are bypass condensers for the signal. Transistor $T_3$ has its emitter biased at constant current by resistance 40 in series with battery 39.

In Fig. 5, the direct current for energizing the transistors flows from grounded battery 38 through resistor 32 and through transistor $T_1$ (2 to 3) and from collector to base (3 to 1) of $T_3$ back to ground.

In Fig. 5 it will be observed that the emitter biasing arrangements for the two transistors are entirely independent of one another. It happens that the manner in which the two batteries are used in this circuit fits very conveniently into usual telephone practice in connection with telephone repeater batteries. While the point contact transistor $T_3$ provides a somewhat lower alternating-current impedance to the signal as compared with an NPN transistor this is partly compensated for by the fact that it also offers a lower direct-current resistance, referring in both instances to present types of transistors.

In Fig. 6 the first or amplifying transistor $T_3$ is of the point contact type while the second or current feed transistor $T_1$ is of the NPN type. Two batteries 42 and 48 are provided for supplying the biases. The same biasing arrangement is used for transistor $T_1$ as in Fig. 5, the base being connected to a point between resistors 45 and 46 bridged across battery 42, while the emitter is connected through resistance 47 to a negative battery. The emitter of $T_3$ is biased at constant current through battery 48 and input resistor 51. Condensers 43 and 44 are bypass condensers for the signal. The circuit of Fig. 6 is generally similar in action to that of Fig. 5, the NPN transistor $T_1$, however, offering higher alternating-current impedance and higher direct-current impedance.

As illustrating in a general way the space saving that is achieved by the invention in avoiding the necessity of transmitting the feed current through the primary winding of the output transformer, a consequent reduction in size of 25 to 1 was found possible in an audio transformer in one instance considered typical. In the case of the input transformer, if one is used, it also can have very small dimensions when used with an NPN type transistor because of the very small base current involved. Alternatively, an input transformer may be replaced by a condenser-resistance coupling of the type shown in certain of the figures. This latter condenser-resistance coupling can also be combined with input transformers of small dimensions in the case of point contact or other transistors where the emitter current is large. The dimensions of the output transformer to the extent above indicated were achieved by use of extremely fine wire in the windings and use of a small core of high permeability material. The bypass condensers were miniaturized by use of tantalum electrolytic type.

The invention is not to be construed as limited to the details of the disclosed embodiments, which are to be taken as illustrative and by way of example. Various modifications and departures from these embodiments can be made within the spirit and scope of the invention.

What is claimed is:

An amplifier which comprises a first transistor having an emitter electrode, a collector electrode, and a base electrode, alternating-current signal input coupling means connected between the emitter and base electrodes of said first transistor, alternating-current signal output coupling means connected between the emitter and collector electrodes of said first transistor, and means to provide a flow of direct energizing current through the emitter and collector electrodes of said first transistor without introducing an alternating-current path between them having either a low impedance or a substantial reactance, said last-mentioned means including a source of direct potential, a second transistor of the same conductivity type as said first transistor having an emitter electrode, a collector electrode, and a base electrode, said first and second transistors and said source being connected to form a series direct-current path which includes the emitter and collector electrodes of said first transistor, the emitter and collector electrodes of said second transistor, and said source, and means to supply a direct operating potential to the base electrode of said second transistor, whereby said second transistor provides a resistance between its emitter and collector electrodes that is many times larger for alternating current than for direct current.

References Cited in the file of this patent

UNITED STATES PATENTS

| | | |
|---|---|---|
| 2,524,035 | Bardeen et al. | Oct. 3, 1950 |
| 2,544,211 | Barton | Mar. 6, 1951 |
| 2,585,077 | Barney | Feb. 12, 1952 |
| 2,585,078 | Barney | Feb. 12, 1952 |
| 2,609,459 | Bergson | Sept. 2, 1952 |
| 2,662,122 | Ryder | Dec. 8, 1953 |
| 2,666,817 | Raisbeck et al. | Jan. 19, 1954 |

OTHER REFERENCES

Terman text: "Radio Engineering" 3d ed., pp. 248, 325, 373. Pub. 1947 by McGraw Hill Book Co., New York. (Copy in Division 69.)